US010247804B2

(12) United States Patent
Nielsen et al.

(10) Patent No.: US 10,247,804 B2
(45) Date of Patent: Apr. 2, 2019

(54) METHOD OF TIME-EFFICIENT 4D MAGNETIC RESONANCE IMAGING

(71) Applicant: KONINKLIJKE PHILIPS N.V., Eindhoven (NL)

(72) Inventors: Tim Nielsen, Hamburg (DE); Sascha Krueger, Hamburg (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 283 days.

(21) Appl. No.: 15/117,217

(22) PCT Filed: Feb. 3, 2015

(86) PCT No.: PCT/EP2015/052113
§ 371 (c)(1),
(2) Date: Aug. 8, 2016

(87) PCT Pub. No.: WO2015/121103
PCT Pub. Date: Aug. 20, 2015

(65) Prior Publication Data
US 2016/0349344 A1 Dec. 1, 2016

(30) Foreign Application Priority Data
Feb. 13, 2014 (EP) .................................. 14155028

(51) Int. Cl.
G01R 33/567 (2006.01)
G01R 33/561 (2006.01)
G01R 33/483 (2006.01)

(52) U.S. Cl.
CPC ..... *G01R 33/5673* (2013.01); *G01R 33/4835* (2013.01); *G01R 33/561* (2013.01); *G01R 33/5676* (2013.01)

(58) Field of Classification Search
CPC ..... G01R 33/20–33/5676; A61B 5/055; A61B 5/0816
See application file for complete search history.

(56) References Cited

U.S. PATENT DOCUMENTS 9,259,189 B2    2/2016   Kassai
9,517,033 B2   12/2016   Kassai
(Continued)

FOREIGN PATENT DOCUMENTS

WO    2010058732 A1    5/2010

OTHER PUBLICATIONS

Hu et al "Respiratory Amplitude Guided 4-Dimensional Magnetic Resonance Imaging" Int. J. Radiation Oncol. Biol. Phys. 86(1) p. 198-204 (2013).

*Primary Examiner* — Huy Q Phan
*Assistant Examiner* — David Frederiksen

(57) ABSTRACT

A method of operating a respiratory-guided magnetic resonance imaging system (10) with regard to triggering of magnetic resonance image acquisition, the magnetic resonance imaging system (10) being connectable to a respiration monitoring device (46) which is configured to provide an output signal (48) whose level represents a respiration state of the subject of interest (20), the method comprising a step (56) of generating an interleaved acquisition scheme for acquiring magnetic resonance images, a step (60) of adapting, in case of an occurrence of an irregularity in the breathing of the subject of interest (20) in the output signal (48) obtained by the respiration monitoring device (46) in the course of executing magnetic resonance image acquisition, at least one parameter of the interleaved acquisition scheme, wherein the at least one adapted parameter is at least one of a next respiration state of the subject of interest (20) to trigger on for acquiring at least one magnetic resonance image, a radio frequency pulse sequence-inherent idle time, and the chronological order of at least one slice of the plurality of slices to be imaged of at least the portion of the subject of interest (20), a step (62) of halting execution of magnetic resonance image acquisition, and a step (64) of resuming execution of magnetic resonance image acquisition pursuant to the interleaved acquisition scheme using the adapted parameter; a respiratory-guided magnetic resonance imaging system (10) having a control unit (26) that is configured to carry out steps (56-64) of an embodiment of the disclosed method; and a software module (44) for (Continued)

carrying out an embodiment of the disclosed method, wherein the method steps (56-64) to be conducted are converted into a program code that is implementable in a memory unit (30) and is executable by a processor unit (32) of the respiratory-guided magnetic resonance imaging system (10).

7 Claims, 5 Drawing Sheets

(56) References Cited

U.S. PATENT DOCUMENTS

| | | | |
|---|---|---|---|
| 2009/0177076 A1* | 7/2009 | Aldefeld | G01R 33/56375 600/410 |
| 2011/0130644 A1 | 6/2011 | Stemmer | |
| 2012/0271155 A1* | 10/2012 | Stemmer | A61B 5/055 600/413 |
| 2013/0085376 A1* | 4/2013 | Ringholz | A61B 5/055 600/413 |
| 2013/0211236 A1* | 8/2013 | Beck | G01R 33/5673 600/413 |
| 2013/0225978 A1* | 8/2013 | Remmele | A61M 16/01 600/420 |
| 2013/0281823 A1* | 10/2013 | Stemmer | A61B 5/055 600/410 |

* cited by examiner

METHOD OF TIME-EFFICIENT 4D MAGNETIC RESONANCE IMAGING

CROSS REFERENCE TO RELATED APPLICATIONS

This application is a U.S. national phase application of International Application No. PCT/EP2015/052113, filed on Feb. 3, 2015, which claims the benefit of EP Application Serial No. 14155028.5 filed on Feb. 13, 2014 and is incorporated herein by reference.

FIELD OF THE INVENTION

The invention pertains to a method of operating a respiratory-guided magnetic resonance imaging system with regard to triggering of magnetic resonance image acquisition and a respiratory-guided magnetic resonance imaging system being operated by employing such a method.

BACKGROUND OF THE INVENTION

In the art of magnetic resonance imaging, it is known to employ four-dimensional (4D) respiratory phase-guided imaging methods for accurate characterization of motion of tumors and/or organs due to respiration of a subject of interest, usually a patient, particularly for abdominal tumor motion tracking.

Further, T2-weighted magnetic resonance imaging is known to provide better tumor-tissue contrast than T1- or T2/T1-weighting but requires long pulse sequence repetition times TR in the range of about 3 s. For using long pulse sequence repetition times TR, different slices of the tumor and/or the organ have to be measured over several breathing cycles.

In the paper by Y. Hu et al., "*Respiratory Amplitude Guided 4-Dimensional Magnetic Resonance Imaging*", Int J Radiation Oncol Biol Phys, 86 (1), 198-204 (2013), a method of acquiring 4D respiratory phase-guided magnetic resonance images is described which comprises a scheme of interleaving the acquisition of different points in time for different slices to be imaged in order to reduce a total acquisition time.

The acquisition scheme is exemplarily illustrated in FIG. 5 for a scan package comprising M=8 slices and N=4 respiratory phases (0%, 50% inspiration, 100%, 50% expiration). The acquisition scheme can be thought of as two nested loops, wherein an inner loop varies a slice index m (m=1, . . . , M), and an outer loop having an index n is executed N times, controlling the respiratory phases. As can be obtained from FIG. 5, not all slices in the inner loop are acquired for the same respiratory phase. Instead, the respiratory phase is selected according to $$\text{respiratory phase} = ((m-1)+(n-1))\% N$$

wherein "%" denotes the modulus operation. The first scan sequence includes magnetic resonance images of the eight slices at respiratory phases n=0, 1, 2, 3, 0, 1, 2, and 3. The second scan sequence includes magnetic resonance images of the eight slices at respiratory phases n=1, 2, 3, 0, 1, 2, 3, and 0. The third scan sequence includes magnetic resonance images of the eight slices at respiratory phases n=2, 3, 0, 1, 2, 3, 0, and 1. The fourth scan sequence includes magnetic resonance images of the eight slices at respiratory phases n=3, 0, 1, 2, 3, 0, 1 and 2.

As is described by Y. Hu et al., using triggers at preselected respiratory levels enables acquiring MRI images at different respiratory states in different respiratory cycles and, thus, eliminates the restriction on the long pulse sequence repetition time TR. By that, more magnetic resonance imaging sequences, in particular T2-weighted magnetic resonance images, are compatible with 4D magnetic resonance imaging.

SUMMARY OF THE INVENTION

It is desirable to further reduce a total elapsed time for acquiring a respiratory phase-guided magnetic resonance imaging scan package, such as the scan package described above.

One reason for an extended total elapsed time may lie in poor triggering to preselected respiratory levels due to a change in breathing pattern of a subject of interest between a preparatory phase and a phase of acquiring magnetic resonance images.

It is therefore an object of the invention to provide a four-dimensional (4D) respiratory phase-guided magnetic resonance imaging method that enables acquiring a scan package with a reduced total elapsed time for achieving improved work flow and improved patient comfort.

In one aspect of the present invention, the object is achieved by a method of operating a respiratory-guided magnetic resonance imaging system with regard to triggering of magnetic resonance image acquisition, wherein the magnetic resonance imaging system is configured for acquiring magnetic resonance images of a plurality of slices from at least a portion of a subject of interest over a plurality of breathing cycles of the subject of interest. The magnetic resonance imaging system is connectable to a respiration monitoring device which is configured to provide an output signal whose level represents a respiration state of the subject of interest.

The method comprises
  a step of generating an interleaved acquisition scheme for acquiring within the plurality of breathing cycles at least one magnetic resonance image of each slice of the plurality of slices at each respiration state of a plurality of selected respiration states of the subject of interest, the triggering on the selected respiration states being based on predetermined threshold signal levels of the respiration monitoring device,
  a step of commencing magnetic resonance image acquisition pursuant to the interleaved acquisition scheme, and, during executing magnetic resonance image acquisition pursuant to the interleaved acquisition scheme,
  a step of adapting, in case of an occurrence of an irregularity in the breathing of the subject of interest in the output signal obtained by the respiration monitoring device in the course of executing magnetic resonance image acquisition pursuant to the interleaved acquisition scheme, at least one parameter of the interleaved acquisition scheme for advancing another acquiring of a magnetic resonance image of the interleaved acquisition scheme, wherein the at least one adapted parameter is at least one of
    a next respiration state of the subject of interest (20) to trigger on for acquiring at least one magnetic resonance image,
    a radio frequency pulse sequence-inherent idle time, and
    the chronological order of at least one slice of the plurality of slices to be imaged of at least the portion of the subject of interest (20), a step of halting execution of magnetic resonance image acquisition pursuant to the interleaved acquisition scheme, and a step of resuming execution of magnetic resonance image acquisition pursuant to the interleaved acquisition scheme using the adapted parameter.

The phrase "interleaved acquisition scheme", as used in this application, shall particularly be understood as a scheme of acquiring magnetic resonance images of at least two different slices within at least one breathing cycle of the plurality of breathing cycles.

It shall be understood that the step of adapting at least one parameter out of the disclosed types of parameters encompasses adapting an arbitrary number of parameters in an arbitrary combination of types.

One advantage of the method lies in that waiting time during acquisition of a scan package and, by that, a total elapsed acquisition time can be reduced. By adapting one or more of these parameters, a substantial reduction of total elapsed time for acquisition can be accomplished.

Another advantage of the method lies in that the triggering of magnetic resonance images can be more robust against irregular fluctuations of the respiratory pattern and, consequently, the output signal of the respiration monitoring device, which are known to be a common problem in respiratory-guided magnetic resonance imaging.

In one embodiment, the magnetic resonance imaging system itself may be used as respiration monitoring device by acquiring and processing respiration-dependent magnetic resonance signals in real-time (1D or 2D navigators).

In yet another preferred embodiment, the method further comprises a step of monitoring a time derivative of the output signal of the respiration monitoring device, and the step of adapting the at least one parameter comprises adapting a next respiration state of the subject of interest to trigger on, wherein the adapting is based on detecting a sign reversal of the time derivative of the output signal.

A missed triggering on a predetermined threshold signal level which is close to a maximum (or minimum) level of the output signal can advantageously be detected by the sign reversal of the time derivative of the output signal, since the sign of the time derivative indicates inspiration and expiration, respectively. If a missed maximum (minimum) predetermined threshold signal level close to a maximum (or minimum) level of the output signal is detected, magnetic resonance images of slices at selected respiration states that have not been acquired so far during expiration (inspiration) may be acquired almost immediately, instead of waiting for almost a whole respiration cycle until occurrence of the next maximum (minimum). Thus, waiting times due to missed triggering can further be reduced.

In a further preferred embodiment, the step of adapting the at least one parameter comprises adapting the radio frequency pulse sequence-inherent idle time, wherein the adapting is based on a recorded accumulated time of waiting for triggering on the selected respiration states. The generated interleaved acquisition scheme may comprise idle times in order to keep the specific absorption rate for the subject of interest within limitations. By adapting the radio frequency pulse sequence-inherent idle times, the total elapsed time for acquisition can be reduced with the magnetic resonance image acquisitions still complying with SAR requirements.

In another aspect of the present invention, a respiratory-guided magnetic resonance imaging system configured for acquiring magnetic resonance images of a plurality of slices from at least a portion of a subject of interest over a plurality of breathing cycles of the subject of interest is provided. The magnetic resonance imaging system is configured to be respiratory-guided and comprises:

an examination space provided to position the subject of interest within;

a main magnet configured for generating a static magnetic field $B_0$ in the examination space;

a magnetic gradient coil system configured for generating gradient magnetic fields superimposed to the static magnetic field $B_0$;

at least one radio frequency antenna that is configured for applying a radio frequency excitation field $B_1$ to nuclei of or within the portion of the subject of interest for magnetic resonance excitation;

at least one radio frequency antenna device that is provided for receiving magnetic resonance signals from the nuclei of or within the portion of the subject of interest that have been excited by applying the radio frequency excitation field $B_1$;

a control unit for controlling at least one function of the magnetic resonance imaging system;

a signal processing unit configured for processing magnetic resonance signals to determine images of slices of at least the portion of the subject of interest from the received magnetic resonance signals.

The respiratory-guided magnetic resonance imaging system is configured for receiving output signals from a respiration monitoring device for triggering guidance, whose output signal level represents a respiration state of the subject of interest. The control unit is configured to carry out steps of an embodiment of any of the disclosed methods of operating the magnetic resonance imaging system with regard to triggering of magnetic resonance image acquisition, or a combination thereof.

Preferably, the at least one radio frequency antenna device that is configured for applying a radio frequency excitation field $B_1$ is configured to be provided with radio frequency pulse sequences that are suitable for obtaining T2-weighted magnetic resonance images. By that, a high tumor-tissue contrast in the magnetic resonance images can be accomplished.

In yet another aspect of the present invention, a software module is provided for carrying out steps of an embodiment of any of the disclosed methods of operating a magnetic resonance imaging system with regard to triggering of magnetic resonance image acquisition, or a combination thereof. The method steps to be conducted are converted into a program code of the software module, wherein the program code is implementable in a memory unit of the magnetic resonance imaging system and is executable by a processor unit of the magnetic resonance imaging system. The processor unit may be the processor unit of the control unit that is customary for controlling functions of a magnetic resonance imaging system. The processor unit may, alternatively or supplementary, be another processor unit that is especially assigned to execute at least some of the method steps.

The software module can enable a robust and reliable execution of the method and can allow for a fast modification of method steps.

BRIEF DESCRIPTION OF THE DRAWINGS

These and other aspects of the invention will be apparent from and elucidated with reference to the embodiments described hereinafter. Such embodiment does not necessarily represent the full scope of the invention, however, and reference is made therefore to the claims herein for interpreting the scope of the invention.

In the drawings.

DETAILED DESCRIPTION OF EMBODIMENTS

Figure 1:
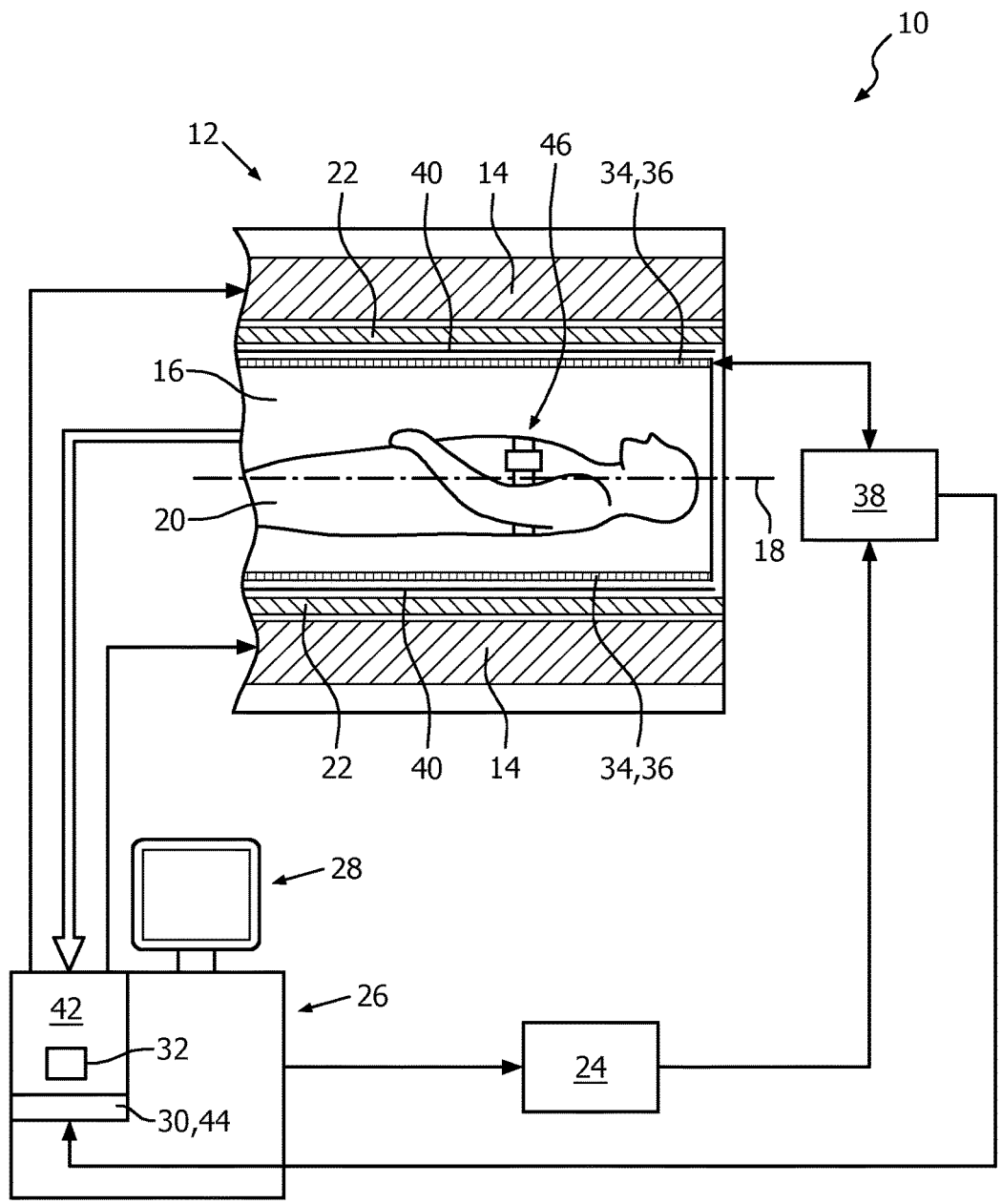
FIG. 1 is a schematic illustration of a part of an embodiment of a respiratory-guided magnetic resonance imaging system in accordance with the invention.

FIG. 1 shows a schematic illustration of a part of an embodiment of a respiratory-guided magnetic resonance imaging system 10 configured for acquiring magnetic resonance images of a plurality of slices from at least a portion of a subject of interest 20, usually a patient, over a plurality of breathing cycles of the subject of interest 20. The respiratory-guided magnetic resonance imaging system 10 comprises a scanning unit 12 having a main magnet 14. The main magnet 14 has a central bore that provides an examination space 16 around a center axis 18 for the subject of interest 20 to be positioned within, and is further configured for generating a static magnetic field $B_0$ of 1.5 T at least in the examination space 16. For clarity reasons, a customary table for supporting the subject of interest 20 is only indicated in FIG. 1. The static magnetic field $B_0$ defines an axial direction of the examination space 16, aligned in parallel to the center axis 18. It is appreciated that the invention is also applicable to any other type of respiratory-guided magnetic resonance imaging system providing an examination region within a static magnetic field.

Further, the respiratory-guided magnetic resonance imaging system 10 comprises a magnetic gradient coil system 22 configured for generating gradient magnetic fields superimposed to the static magnetic field $B_0$. The magnetic gradient coil system 22 is concentrically arranged within the bore of the main magnet 14, as is known in the art.

The respiratory-guided magnetic resonance imaging system 10 comprises a control unit 26 provided to control functions of the scanning unit 12, the magnetic gradient coil system 22, and other functions of the respiratory-guided magnetic resonance imaging system 10. The control unit 26 includes a human interface device designed as a monitor unit having a touch-sensitive screen 28.

Furthermore, the respiratory-guided magnetic resonance imaging system 10 includes a radio frequency antenna device 34 designed as a whole-body coil that is configured for applying a radio frequency field $B_1$ to nuclei of or within the subject of interest 20 for magnetic resonance excitation during radio frequency transmit time periods to excite the nuclei of or within the subject of interest 20 for the purpose of magnetic resonance imaging. To this end, radio frequency power is fed, controlled by the control unit 26, from a radio frequency transmitter unit 24 to the whole-body coil. The whole-body coil has a center axis and, in the operational state, is arranged concentrically within the bore of the main magnet 14 such that the center axis of the whole-body coil and the center axis 18 of the examination space 16 coincide. As is common in the art, a cylindrical metal radio frequency shield 40 is arranged concentrically between the magnetic gradient coil system 22 and the whole-body coil.

The whole-body coil is also provided for receiving magnetic resonance signals during radio frequency receive phases from the nuclei of or within the portion of the subject of interest 20 that have been excited by the transmitted radio frequency field $B_1$. In an operational state of the respiratory-guided magnetic resonance imaging system 10, radio frequency transmit phases and radio frequency receive phases are taking place in a consecutive manner.

The radio frequency transmitter unit 24 is provided to feed radio frequency power of a magnetic resonance radio frequency and in the form of turbo spin echo (TSE) radio frequency pulse sequences to the whole-body coil via a radio frequency switching unit 38 during the radio frequency transmit phases, enabling to obtain T2-weighted magnetic resonance images. During the radio frequency receive phases, the radio frequency switching unit 38, controlled by the control unit 26, directs the magnetic resonance signals from the whole-body coil to a signal processing unit 42 residing in the control unit 26. The signal processing unit 42 is configured for processing magnetic resonance signals to determine images of slices of at least the portion of the subject of interest 20 from the acquired magnetic resonance signals. Many different variations of this technique are well known to the person skilled in the art, and thus need not be described in further detail herein.

Each of the turbo spin echo radio frequency pulse sequences has a length of 270 ms, followed by a sequence-inherent idle time of 106 ms.

The respiratory-guided magnetic resonance imaging system 10 further comprises a respiration monitoring device 46. The respiration monitoring device 46 includes a respiration sensor that, in an operational state, is attached to the thorax of the subject of interest 20 and is held by a belt, wound around the thorax. The respiration monitoring device 46 is configured to provide the control unit 26 with an output signal 48 whose level represents a respiration state of the subject of interest 20. To this end, an output line of the respiration monitoring device 46 is connected to the control unit 26. The control unit 26 of the respiratory-guided magnetic resonance imaging system 10 is configured for receiving output signals 48 from the respiration monitoring device 46 for triggering guidance, as will be described in more detail later on.

Figure 2:
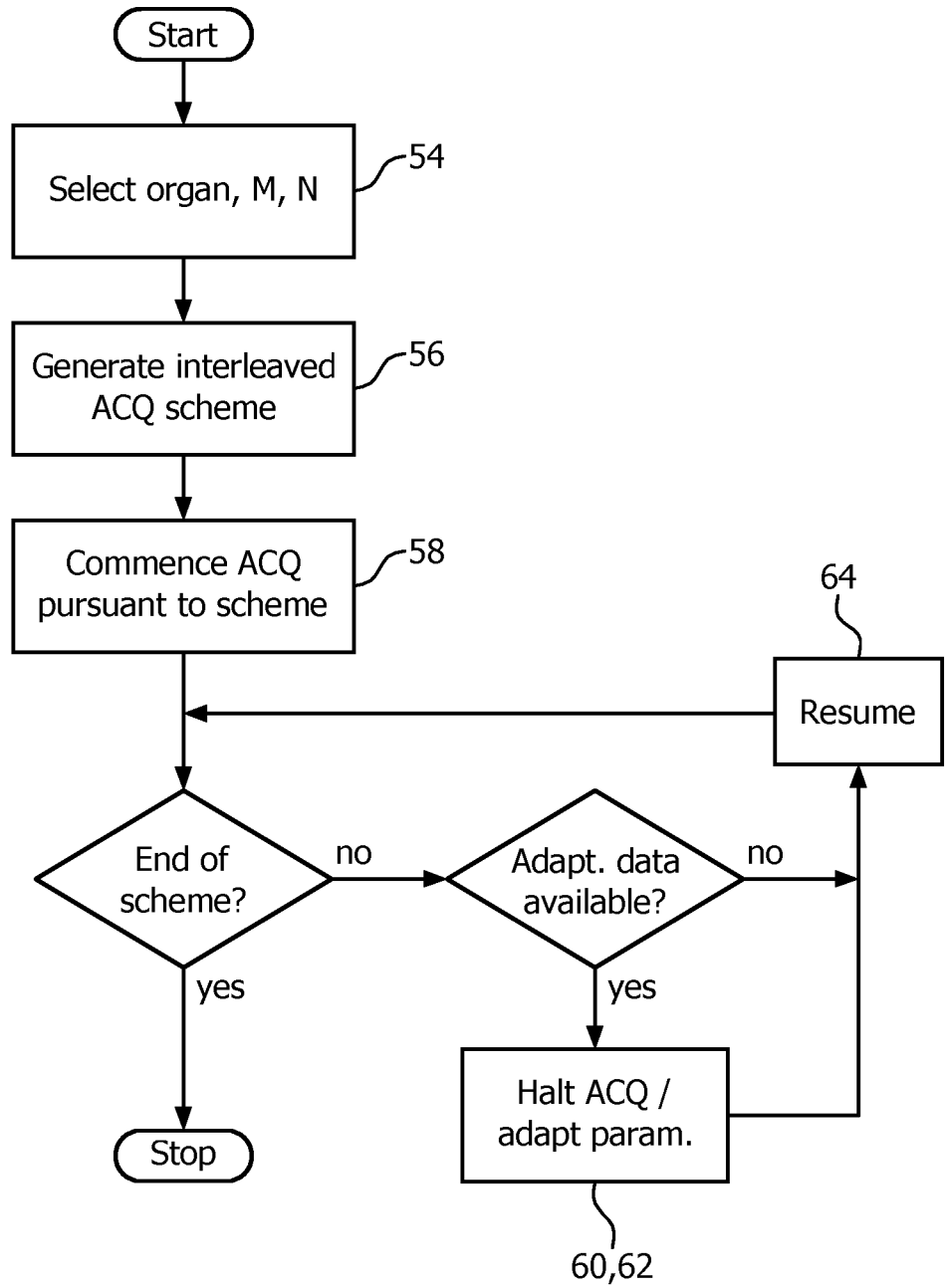
FIG. 2 shows a flow chart of an embodiment of the method in accordance with the invention.

In the following, an embodiment of a method of operating the respiratory-guided magnetic resonance imaging system 10 with regard to triggering of magnetic resonance image acquisitions is described. A principal flow chart of the method is given in FIG. 2. In preparation of operating the respiratory-guided magnetic resonance imaging system 10, it shall be understood that all involved units and devices are in an operational state and configured as illustrated in FIG. 1.

In order to be able to carry out the method as a specific operation of the respiratory-guided magnetic resonance imaging system 10, the control unit 26 comprises a software module 44 (FIG. 1). The method steps to be conducted are converted into a program code of the software module 44, wherein the program code is implementable in a memory unit 30 of the control unit 26 and is executable by a processor unit 32 of the control unit 26.

In a first step 54 of the method, the operator, via the human interface, selects the portion of the subject of interest to be imaged, the number of slices to be imaged from the portion of the subject of interest 20, and respiration states of the subject of interest 20 that the acquiring of the magnetic resonance images shall be triggered on. In a preceding preparatory calibration measurement, threshold signal levels 50 of the output signal 48 of the respiration monitoring device 46 which the triggering shall be based on and which correspond to the selected respiration states have been determined. Values of the threshold signal levels 50 are stored in the memory unit 30 of the control unit 26.

In a next step 56, an interleaved acquisition scheme for acquiring one magnetic resonance image of each slice of the plurality of selected slices and each respiration state of the plurality of selected respiration states of the subject of interest 20 is generated. For a number of N=4 respiration states and a number of M=8 slices, the generated interleaved acquisition scheme may be similar to the prior art acquisition scheme shown in FIG. 5.

In another step 58 then, magnetic resonance image acquisition pursuant to the generated interleaved acquisition scheme commences, with the following exception. A current position in the respiratory cycle is determined, and in a following step 60, on the basis of the determined current position in the respiratory cycle, a parameter of the generated interleaved acquisition scheme given as the next respiration state of the subject of interest 20 to trigger on for acquiring a magnetic resonance image is adapted. Instead of pursuing the beginning of the fixed interleaved acquisition scheme, which would be the respiration state of 0% (FIG. 5), that respiratory phase is selected for acquiring a magnetic resonance image which follows next in time after the current position in the respiratory cycle, and for which no magnetic resonance image has yet been acquired, in this case a respiration state of 50% inspiration (FIG. 3).

In the next step 62, execution of magnetic resonance image acquisition pursuant to the generated interleaved acquisition scheme is halted. Then, execution of magnetic resonance image acquisition is resumed in another step 64 pursuant to the interleaved acquisition scheme and using the adapted parameter, which is the respiration state of 50% inspiration, illustrated in the left part of the time chart given in FIG. 3 (which shows the output signal 48 of the respiration monitoring device 46 over time) as a filled circle symbol at the time mark of 50 s.

Figure 3:
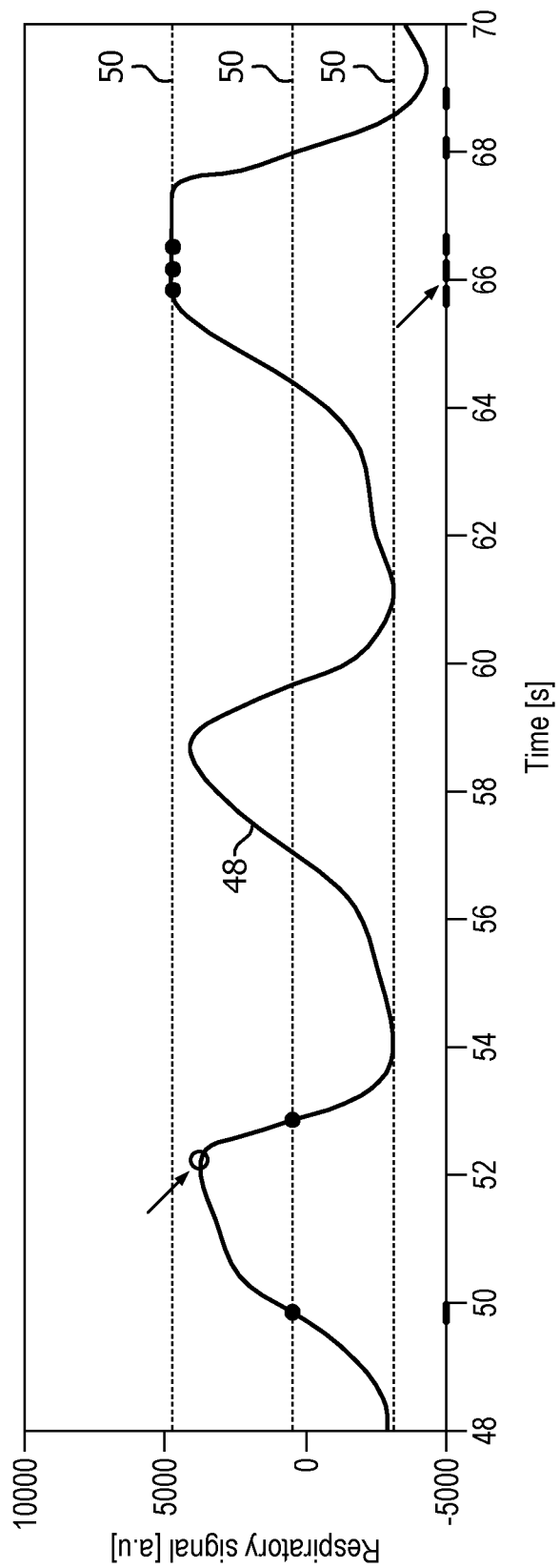
FIG. 3 shows a time chart of an output signal of the respiration monitoring device pursuant to FIG. 1 with exemplary steps of adapting parameters of an interleaved acquisition scheme in accordance with the invention.

Another example of adapting a parameter of the interleaved acquisition scheme on the basis of data obtained in the course of executing magnetic resonance image acquisition pursuant to the interleaved acquisition scheme is shown in FIG. 3 between the time marks of 52 s and 54 s, respectively. In FIG. 3, predetermined threshold signal levels 50 corresponding to respiration states of 0%, 50% and 100%, respectively, are shown as dashed horizontal lines. An open circle close to the time mark of 52 s indicates that the predetermined threshold signal level corresponding to the respiration state of 100% has been missed due to fluctuations in the breathing pattern of the subject of interest 20. As a side note, it is clear from FIG. 3 that the predetermined threshold signal level corresponding to the respiration state of 100% would also have been missed in the next respiration cycle.

The missing of the predetermined threshold signal level corresponding to the respiration state of 100% has been detected during executing magnetic resonance image acquisition pursuant to the interleaved acquisition scheme by monitoring a time derivative of the output signal 48 of the respiration monitoring device 46. A sign reversal of the time derivative of the output signal 48 had occurred without any triggering on the respiration state of 100%, in contrast to what has been specified by the generated interleaved acquisition scheme.

In a step 60 of adapting another parameter of the interleaved acquisition scheme, the next respiration state of the subject of interest 20 to trigger on is changed to 50% expiration. After a step 62 of halting execution of magnetic resonance image acquisition and a step of resuming 64 execution of magnetic resonance image acquisition pursuant to the interleaved acquisition scheme using the adapted parameter, i.e. the next respiration state of 50% expiration, the predetermined threshold signal level 50 corresponding to this respiration state is then met, as is indicated by the full circle symbol between the time marks of 52 s and 54 s, respectively.

The right portion of FIG. 3 illustrates another example of adapting a parameter of the interleaved acquisition scheme, the parameter given by a next respiration state of the subject of interest 20 to trigger on for acquiring a magnetic resonance image. Here, in the course of executing magnetic resonance image acquisition pursuant to the interleaved acquisition scheme, it was detected by monitoring the time derivative of the output signal 48 of the respiration monitoring device 46 that the respiration state of 100% inspiration lasts longer than on the average. As a consequence, the next respiration state of the subject of interest 20 to trigger on was adapted twice in a row to 100% inspiration, so that magnetic resonance images of a total of three different slices could be acquired in this state of respiration.

The right portion of FIG. 3 also illustrates an example of adapting another parameter of the interleaved acquisition scheme, the parameter given by the radio frequency pulse sequence-inherent idle time. The step 60 of adapting is based on a recorded accumulated time of waiting for triggering on the next selected respiration states, carried out by the control unit 26. The control unit 26 is configured to check if in the history of executing the interleaved acquisition scheme sufficient waiting time has been accumulated to comply with SAR limitations. If so, the radio frequency pulse sequence-inherent idle time of the three TSE radio frequency pulse sequences for acquiring the above-described three different slices at the respiration state of 100% inspiration is shortened, as illustrated in FIG. 3 around the time mark of 66 s.

Figure 4:
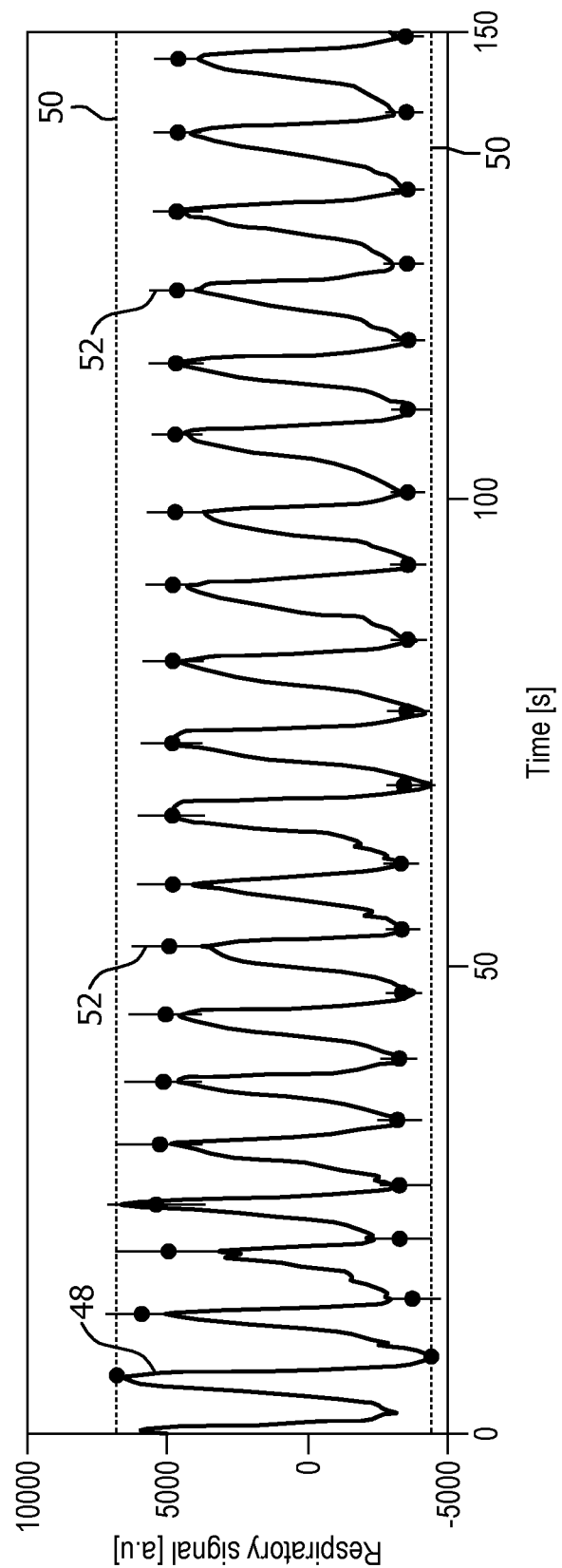
FIG. 4 shows a time chart with an example for adapting a parameter of the interleaved acquisition scheme, given by a predetermined threshold signal level, in accordance with the invention, and FIG. 5 describes an interleaved acquisition scheme employed in a prior art method.

FIG. 4 exemplarily shows a time chart of the output signal 48 of the respiration monitoring device 46 in a time period of executing magnetic resonance image acquisition pursuant to the interleaved acquisition scheme. The dashed lines indicate a level of a maximum output signal 48 and a level of a minimum output signal 48 determined in the preparatory calibration measurement preceding the execution of magnetic resonance imaging acquisition. Tolerance ranges 52 are indicated by vertical lines at the maxima and minima of the output signal 48.

The control unit 26 is configured to monitor levels of maximum output signal 48 and levels of minimum output signal 48 of the respiration monitoring device 46 over time. Further, the control unit 26 is configured to carry out a step 60 of adapting parameters of the interleaved acquisition scheme on the basis of the levels of maximum and minimum output signals 48 obtained in the course of executing magnetic resonance image acquisition pursuant to the interleaved acquisition scheme, the parameters given by the predetermined threshold signal levels 50 of the respiration monitoring device 46. The step 60 of adapting comprises adapting the predetermined threshold signal levels 50 of the respiration monitoring device 46 by consecutively updating the maximum level of the output signal 48, the minimum level of the output signal 48 and the tolerance range of the predetermined threshold signal levels 50 by values obtained by applying Kalman filtering to the monitored levels of maximum output signal 48 and levels of minimum output signal 48 of the respiration monitoring device 46 over time. New predetermined threshold signal levels 50 of the respiration monitoring device 46 are derived from the updated maximum and minimum levels of the output signal 48.

Then, the new predetermined threshold signal levels 50 are implemented into the interleaved acquisition scheme between a step 62 of halting and a step 64 of resuming execution of the magnetic resonance image acquisition as described above.

Thereby, the triggering on the selected respiration states based on predetermined threshold signal levels 50 can be stabilized against signal drift or variations of the breathing pattern, as is obvious from FIG. 4. The maximum level of the output signal 48 and the minimum level of the output signal 48 obtained in the preceding calibration measurement have proven inadequate, and the adapted levels of maximum and minimum output signal 48 converge to appropriate values within the first five respiratory cycles. The step 60 of adapting at least one parameter of the interleaved acquisition scheme on the basis of data obtained in the course of executing magnetic resonance image acquisition pursuant to the interleaved acquisition scheme can also be carried out on the parameter of the chronological order of the plurality of slices to be imaged of at least the portion of the subject of interest 20.

Figure 5:
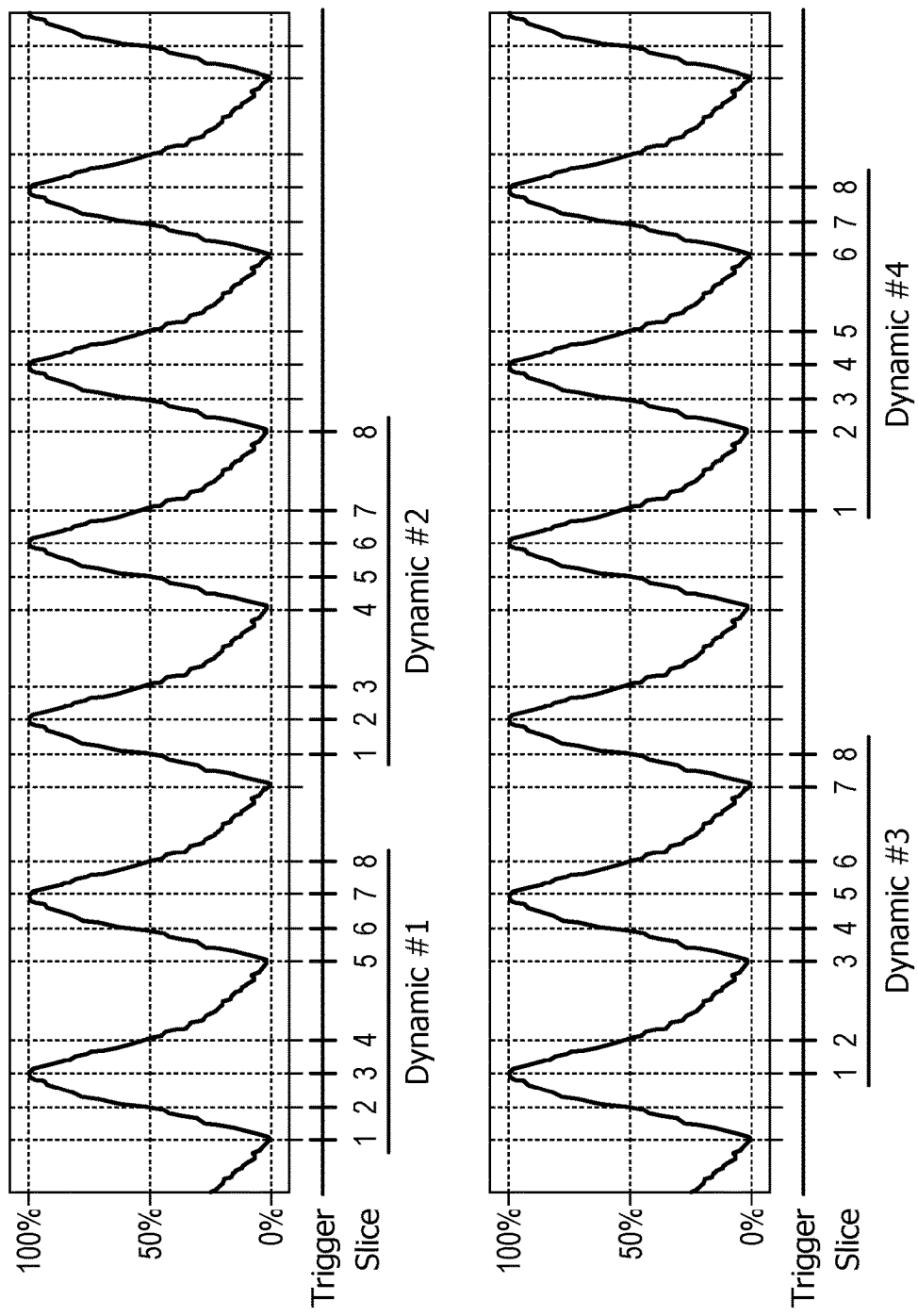

Usually, in the interleaved acquisition scheme the chronological order of the plurality of slices to be imaged is fixed (as in the prior art interleaved acquisition scheme shown in FIG. 5).

The advantage of adapting the chronological order of slices to be imaged becomes most apparent towards an end of executing the interleaved acquisition scheme. In this phase, magnetic resonance images of each slice has been acquired for almost all the selected respiration states of the subject of interest 20. In this situation, there is hardly any freedom to adapt the parameter of a next respiration state of the subject of interest 20 to trigger on for acquiring a magnetic resonance image, and one has to wait for a time corresponding to half a respiration cycle on average for triggering on the desired respiration state.

If, for instance, in the example of the scanned package having a number of N=4 respiration states and a number of M=8 slices the only missing magnetic resonance images are the respiration state of 100% inspiration for slices #1 to #4 and the respiration state of 0% for slices #5 to #8, eight respiration cycles would be necessary for completing the interleaved acquisition scheme if the chronological order of imaging the slices would be kept as m=1, 2, 3, . . . , 8.

If instead the chronological order of imaging the slices would be adapted to m=1, 5, 2, 6, 3, 7, 4, 8, only four respiration cycles would be required for completing the interleaved acquisition scheme, provided that two magnetic resonance images could be taken at the respiration states of 0% and 100%, respectively.

Various embodiments of the step of adapting parameters of the interleaved acquisition scheme have been disclosed herein. It will be appreciated by a person skilled in the art that the step of adapting is applicable to an arbitrary number of parameters in an arbitrary combination of the disclosed types of parameters.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 10 respiratory-guided magnetic resonance imaging system
12 scanning unit
14 main magnet
16 examination space
18 center axis
20 subject of interest
22 magnetic gradient coil system
24 radio frequency transmitter unit
26 control unit
28 touch-sensitive screen
30 memory unit
32 processor unit
34 radio frequency antenna device (transmit)
36 radio frequency antenna device (receive)
38 radio frequency switching unit
40 radio frequency shield
42 signal processing unit
44 software module
46 respiration monitoring device
48 output signal
50 threshold signal level
52 tolerance range
54 step of selecting
56 step of generating scheme
58 step of commencing execution
60 step of adapting parameter
62 step of halting execution
64 step of resuming execution
$B_0$ static magnetic field
$B_1$ radio frequency field

The invention claimed is:

1. A method of operating a respiratory-guided magnetic resonance imaging system with regard to triggering of magnetic resonance image acquisition, the magnetic resonance imaging system being configured for acquiring magnetic resonance images of a plurality of slices from at least a portion of a subject of interest over a plurality of breathing cycles of the subject of interest, and the magnetic resonance imaging system being connectable to a respiration monitoring device which is configured to provide an output signal whose level represents a respiration state of the subject of interest, the method comprising:

generating an interleaved acquisition scheme for acquiring within the plurality of breathing cycles at least one magnetic resonance image of each slice of the plurality of slices at each respiration state of a plurality of selected respiration states of the subject of interest, the triggering on the selected respiration states being based on predetermined threshold signal levels of the respiration monitoring device, commencing magnetic resonance image acquisition pursuant to the interleaved acquisition scheme, and, during executing magnetic resonance image acquisition pursuant to the interleaved acquisition scheme, adapting, in case of an occurrence of an irregularity in the breathing of the subject of interest in the output signal obtained by the respiration monitoring device in the course of executing magnetic resonance image acquisition pursuant to the interleaved acquisition scheme, at least one parameter of the interleaved acquisition scheme for advancing another acquiring of a magnetic resonance image of the interleaved acquisition scheme, wherein the at least one adapted parameter is at least one of:

a next respiration state of the subject of interest to trigger on for acquiring at least one magnetic resonance image, a radio frequency pulse sequence-inherent idle time, and a chronological order of at least one slice of the plurality of slices to be imaged of at least the portion of the subject of interest, halting execution of magnetic resonance image acquisition pursuant to the interleaved acquisition scheme, and resuming execution of magnetic resonance image acquisition pursuant to the interleaved acquisition scheme using the adapted parameter.

2. The method as claimed in claim 1, further comprising monitoring a time derivative of the output signal of the respiration monitoring device, wherein adapting the at least one parameter comprises adapting a next respiration state of the subject of interest to trigger on, and wherein the adapting is based on detecting a sign reversal of the time derivative of the output signal.

3. The method as claimed in claim 1, wherein adapting the at least one parameter comprises adapting the radio frequency pulse sequence-inherent idle time, and wherein the adapting is based on a recorded accumulated time of waiting for triggering on the selected respiration states.

4. A respiratory-guided magnetic resonance imaging system configured for acquiring magnetic resonance images of a plurality of slices from at least a portion of a subject of interest over a plurality of breathing cycles of the subject of interest, comprising:

an examination space provided to position the subject of interest within;

a main magnet configured for generating a static magnetic field $B_0$ in the examination space;

a magnetic gradient coil system configured for generating gradient magnetic fields superimposed to the static magnetic field $B_0$;

at least one radio frequency antenna device that is configured for applying a radio frequency excitation field $B_1$ to nuclei of or within the portion of the subject of interest for magnetic resonance excitation;

at least one radio frequency antenna device that is provided for receiving magnetic resonance signals from the nuclei of or within the portion of the subject of interest that have been excited by applying the radio frequency excitation field $B_1$;

a control unit for controlling at least one function of the magnetic resonance imaging system;

a signal processing unit configured for processing magnetic resonance signals to determine images of slices of at least the portion of the subject of interest from the received magnetic resonance signals;

wherein the magnetic resonance imaging system is configured for receiving output signals from a respiration monitoring device for triggering guidance, whose level represents a respiration state of the subject of interest, and wherein the control unit is configured to carry out steps of the method as claimed in claim 1.

5. The respiratory-guided magnetic resonance imaging system as claimed in claim 4, wherein the at least one radio frequency antenna device that is configured for applying a radio frequency excitation field $B_1$ is configured to be provided with radio frequency pulse sequences that are suitable for obtaining T2-weighted magnetic resonance images.

6. A non-transitory computer-readable medium carrying software configured to control a processor of a respiratory-guided magnetic resonance imaging system to perform the method as claimed in claim 1 of operating the respiratory-guided magnetic resonance imaging system with regard to triggering of magnetic resonance image acquisition.

7. A respiratory-guided magnetic resonance imaging system configured for acquiring magnetic resonance images of a plurality of slices from at least a portion of a subject of interest over a plurality of breathing cycles of the subject of interest, comprising:

a main magnet configured for generating a static magnetic field $B_0$ in an examination space configured for receiving a portion of a subject of interest;

a magnetic gradient coil system configured for generating gradient magnetic fields superimposed to the static magnetic field $B_0$;

at least one radio frequency antenna configured for applying a radio frequency excitation field $B_1$ to nuclei of or within the portion of the subject of interest for magnetic resonance excitation and for receiving magnetic resonance signals from the nuclei of or within the portion of the subject of interest that have been excited by applying the radio frequency excitation field $B_1$;

at least one processor configured for controlling at least one function of the magnetic resonance imaging system to:

receive output signals from a respiration monitoring device for triggering guidance, whose level represents a respiration state of the subject of interest, generate an interleaved acquisition scheme for acquiring within the plurality of breathing cycles at least one magnetic resonance image of each slice of the plurality of slices at each respiration state of a plurality of selected respiration states of the subject of interest, the triggering on the selected respiration states being based on predetermined threshold signal levels of the respiration monitoring device, commence magnetic resonance image acquisition pursuant to the interleaved acquisition scheme, and, during executing magnetic resonance image acquisition pursuant to the interleaved acquisition scheme, adapt, in case of an occurrence of an irregularity in the breathing of the subject of interest in the output signal obtained by the respiration monitoring device in the course of executing magnetic resonance image acquisition pursuant to the interleaved acquisition scheme, at least one parameter of the interleaved acquisition scheme for advancing another acquiring of a magnetic resonance image of the interleaved acquisition scheme, wherein the at least one adapted parameter is at least one of:

a next respiration state of the subject of interest to trigger acquisition of magnetic resonance image data, a radio frequency pulse sequence-inherent idle time, and a chronological order of at least one slice of the plurality of slices to be imaged of at least the portion of the subject of interest, halt execution of magnetic resonance image acquisition pursuant to the interleaved acquisition scheme, and resume execution of magnetic resonance image acquisition pursuant to the interleaved acquisition scheme using the adapted parameter;

reconstruct the magnetic resonance data into images of slices of at least the portion of the subject of interest.

* * * * *